United States Patent
Shibasaki et al.

(10) Patent No.: US 8,299,948 B2
(45) Date of Patent: Oct. 30, 2012

(54) RECEIVING CIRCUIT AND SAMPLING CLOCK CONTROL METHOD

(75) Inventors: Takayuki Shibasaki, Kawasaki (JP); Masaya Kibune, Kawasaki (JP); Takuji Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 13/023,765

(22) Filed: Feb. 9, 2011

(65) Prior Publication Data
US 2011/0221491 A1 Sep. 15, 2011

(30) Foreign Application Priority Data
Mar. 11, 2010 (JP) ................................ 2010-54894

(51) Int. Cl.
*H03M 1/12* (2006.01)
(52) U.S. Cl. .................... 341/155; 327/156; 375/355
(58) Field of Classification Search .................. 341/155; 327/156; 375/355
See application file for complete search history.

(56) References Cited

U.S. PATENT DOCUMENTS

| | | | |
|---|---|---|---|
| 6,556,640 B1 | 4/2003 | Baba | |
| 7,069,481 B2 * | 6/2006 | Lee et al. | 714/707 |
| 7,167,533 B2 * | 1/2007 | Glenn et al. | 375/371 |
| 7,310,397 B2 * | 12/2007 | Smith et al. | 375/355 |
| 8,014,480 B1 * | 9/2011 | Zhuang et al. | 375/355 |
| 2008/0124092 A1 * | 5/2008 | Dvir et al. | 398/155 |

FOREIGN PATENT DOCUMENTS

| | | |
|---|---|---|
| JP | 10-32566 A | 2/1998 |
| JP | 11-168455 A | 6/1999 |
| JP | 2009-77134 A | 4/2009 |

* cited by examiner

*Primary Examiner* — Khai M Nguyen
(74) *Attorney, Agent, or Firm* — Fujitsu Patent Center

(57) ABSTRACT

A receiving circuit includes: a clock generating circuit to generate a plurality of clock signals in a cycle; an oversampling circuit to oversample input data based on the plurality of clock signals and output a plurality of samples of digital data in a unit interval; a data boundary determining circuit to detect a changing point of the digital data, determine data boundaries of the unit interval based on the changing point, and output digital data corresponding to a central data between the data boundaries; and a clock phase control circuit to control a phase of at least one of the plurality of clock signals so that a first number of the plurality of samples becomes a certain value when a second number of samples between the data boundaries is larger than a threshold value.

16 Claims, 21 Drawing Sheets

RECEIVING CIRCUIT AND SAMPLING CLOCK CONTROL METHOD

CROSS-REFERENCE TO RELATED APPLICATIONS

This application claims the benefit of priority from Japanese Patent Application No. 2010-54894 filed on Mar. 11, 2010, the entire contents of which are incorporated herein by reference.

BACKGROUND

1. Field

The embodiments discussed herein relate to a receiving circuit and a sampling clock control method.

2. Description of the Related Art

A number of input/output (I/O) channels on a system, a substrate or a semiconductor chip may increase. In order to transmit and receive signals through multiple channels, a clock data recovery (CDR) circuit supports multiple channels. In order to support multiple channels, oversampling may be performed.

Related art are disclosed in Japanese Laid-open Patent Publication No. H11-168455, Japanese Laid-open Patent Publication No. H10-32566, Japanese Laid-open Patent Publication No. 2009-77134 and the like.

SUMMARY

According to one aspect of the embodiments, a receiving circuit includes: a clock generating circuit to generate a plurality of clock signals in a cycle; an oversampling circuit to oversample input data based on the plurality of clock signals and output a plurality of samples of digital data in a unit interval; a data boundary determining circuit to detect a changing point of the digital data, determine data boundaries of the unit interval based on the changing point, and output digital data corresponding to a central data between the data boundaries; and a clock phase control circuit to control a phase of at least one of the plurality of clock signals so that a first number of the plurality of samples becomes a certain value when a second number of samples between the data boundaries is larger than a threshold value.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

DESCRIPTION OF THE EMBODIMENTS

Figure 1:
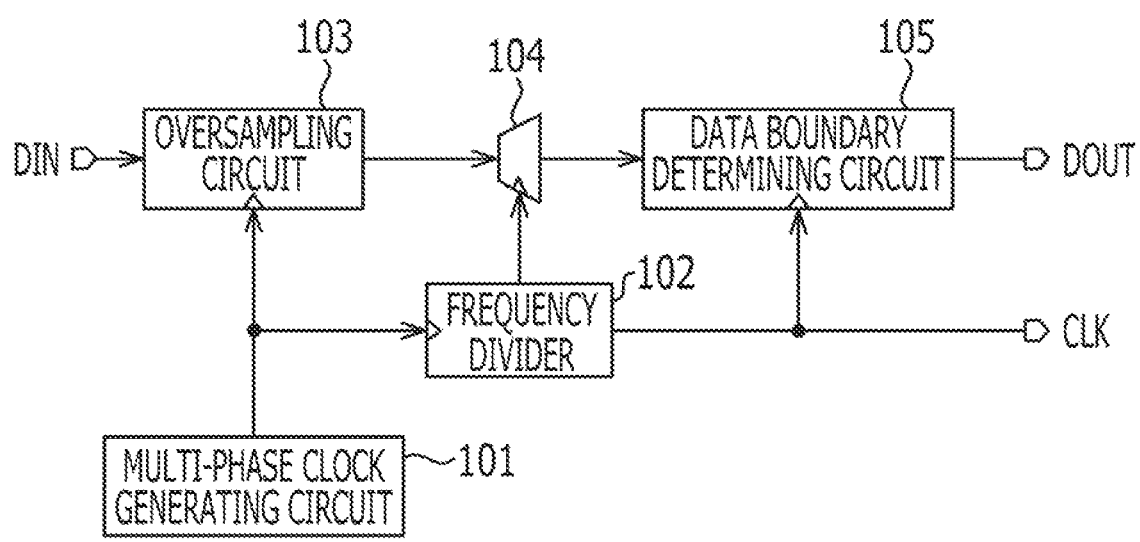
FIG. 1 illustrates an exemplary CDR circuit.
Figure 2:
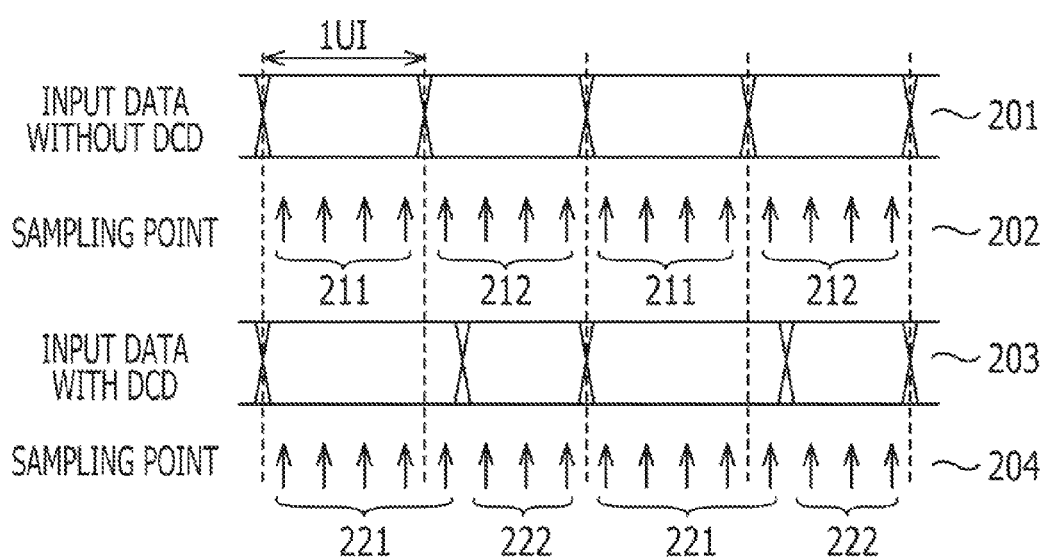
FIG. 2 illustrates an exemplary operation of the CDR circuit.

FIG. 1 illustrates an exemplary CDR circuit. FIG. 2 illustrates an exemplary operation of the CDR circuit. The CDR circuit illustrated in FIG. 1 is included in a receiving device, for example. The operation illustrated in FIG. 2 may be performed by the CDR circuit illustrated in FIG. 1. Input data 201 illustrated in FIG. 2 indicates input data that does not have duty cycle distortion (DCD), while input data 203 illustrated in FIG. 2 indicates input data that has DCD. Sampling points 202 indicate sampling points for the input data 201, while sampling points 204 indicate sampling points for the input data 203. One unit interval (UI) is the time duration for one-bit data of input data to be processed, or is one cycle of a bit clock.

A multi-phase clock generating circuit 101 illustrated in FIG. 1 generates multiple clock signals having different phases in one cycle. A frequency divider 102 divides the frequencies of the clock signal which is generated by the multi-phase clock generating circuit 101 and outputs the clock signal clk. An oversampling circuit 103 oversamples input data din based on the clock signals with the different phases generated by the multi-phase clock generating circuit 101, and outputs a plurality of samples of digital data corresponding to the input data din for a unit interval (UI). The input data din illustrated in FIG. 1 may be the input data 201 illustrated in FIG. 2. The input data 201 is sampled to four samples of the digital data in each of unit intervals, for example. One cycle may correspond to two unit intervals (UIs). The oversampling circuit 103 outputs digital data that is obtained by sampling the input data din at eight sampling points in each of cycles (or in every two unit intervals), for example.

A demultiplexing circuit 104 converts the digital data output from the oversampling circuit 103 from serial data to parallel data in synchronization with the frequency-divided clock signals clk output from the frequency divider 102, and outputs the converted digital data to a data boundary determining circuit 105. The demultiplexing circuit 104 may set a bit rate of the digital data at which a circuit located on the downstream side of the demultiplexing circuit 104 can process the digital data.

The data boundary determining circuit 105 receives the digital data from the demultiplexing circuit 104, determines data boundaries of one unit interval, and outputs digital data dout at a substantially central portion between the data boundaries. The CDR circuit recovers the digital data dout and the clock signals clk based on the input data din.

The input data 201 without DCD includes data, which is generated in synchronization with a clock signal by a transmitting circuit, and is supplied to a receiving circuit. The duty cycle of the clock signal of the transmitting circuit corresponding to the input data 201 without DCD may be 50%. The number of times of sampling of the input data 201 in each of odd-numbered unit intervals 211 defined by rising edges of the clock signal may be 4, while the number of times of sampling of the input data 201 in each of even-numbered unit intervals 212 defined by falling edges of the clock signal may be 4. The unit intervals 211 and 212 may be substantially equal to each other, while the numbers of times of sampling of the input data 201 in the unit intervals 211 and 212 may be substantially equal to each other. Since the number of times of sampling of the input data in each of the unit intervals is 4, data in each of the unit intervals may be correctly recovered.

The input data 203 that has DCD includes data, which is generated in synchronization with a clock signal by the transmitting circuit, and is supplied to the receiving circuit. The duty cycle of the clock signal of the transmitting circuit corresponding to the input data 203 with DCD may be larger than 50%. The number of times of sampling of the input data 203 in each of odd-numbered unit intervals 221 defined by the rising edges of the clock signal may be 5, while the number of times of sampling of the input data 203 in even-numbered unit intervals 222 defined by the falling edges of the clock signal may be 3. When the frequency of the clock signal is high, the timings of the rising edges of the clock signal and the timings of the falling edges of the clock signal may be changed due to a semiconductor process, and the duty cycle of the clock signal may be changed from 50%. For the input data 203 with DCD, the odd-numbered unit intervals 221 are substantially equal to each other, while the even-numbered unit intervals 222 are substantially equal to each other. For the input data 203, each cycle includes a long odd-numbered unit interval 221 and a short even-numbered unit interval 222. Since the even-numbered unit intervals 222 becomes short, the number of times of sampling of the input data 203 in each of the even-numbered unit intervals 222 may become small, and the accuracy of recovery of the data may be reduced.

Figure 3:
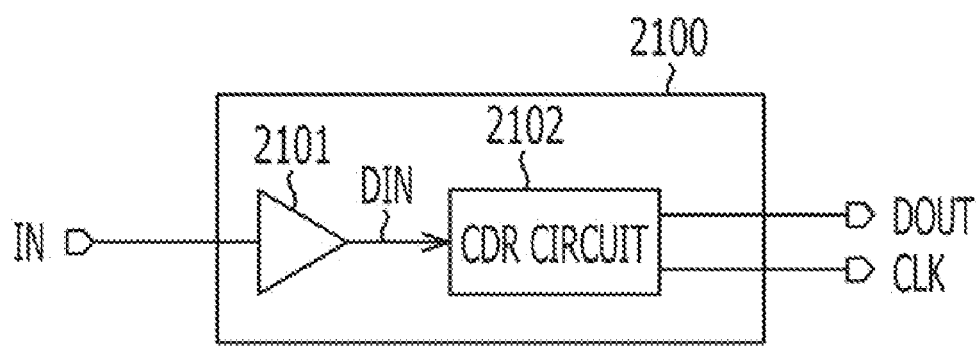
FIG. 3 illustrates an exemplary receiving circuit.

FIG. 3 illustrates an exemplary receiving circuit. A receiving circuit 2100 includes an amplifier 2101 and a CDR circuit 2102. The receiving circuit 2100 receives data IN through a cable from the transmitting circuit and outputs data dout and clock signals clk. The amplifier 2101 amplifies the data IN and outputs the amplified data din to the CDR circuit 2102. The CDR circuit 2102 receives the data din and outputs the data dout and the clock signals clk based on the data din. The data dout and the clock signals clk may be processed by a signal processing circuit that is located on the downstream side of the receiving circuit 2100.

Figure 4:
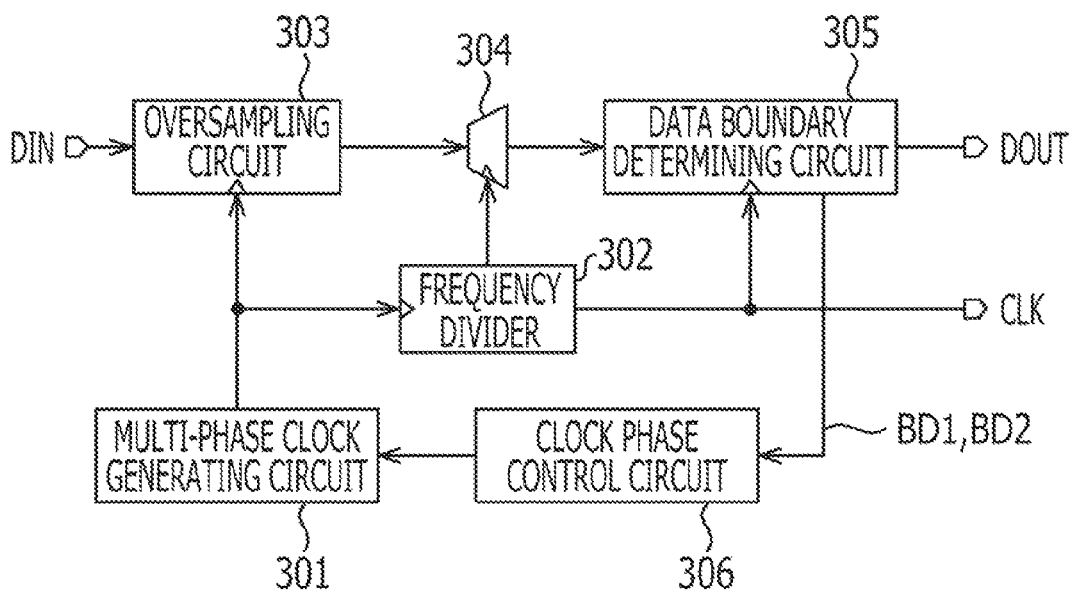
FIG. 4 illustrates an exemplary CDR circuit.
Figure 5:
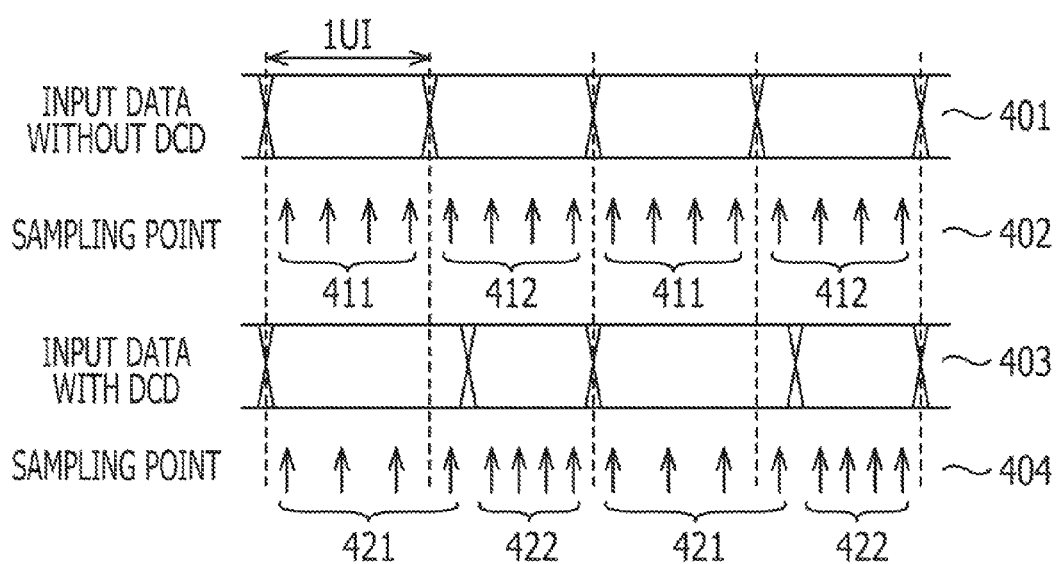
FIG. 5 illustrates an exemplary operation of the CDR circuit.

FIG. 4 illustrates an exemplary CDR circuit. The receiving circuit 2100 illustrated in FIG. 3 may include the CDR circuit illustrated in FIG. 4. FIG. 5 illustrates an exemplary operation of the CDR circuit. The CDR circuit 2102 illustrated in FIG. 4 may perform the operation illustrated in FIG. 5. The CDR circuit 2102 may be included in a receiving circuit that is used as a high-speed I/O circuit that transmits and receives a signal at a high bit rate in an integrated circuit or between chips (or in a device or between devices). The data rate of transfer/reception of the signal in and outside a device may be high. In order to increase a data rate per channel, a data signal including information on a clock signal is transmitted, and data is received by recovering the clock signal by the CDR circuit 2102 in the receiving circuit 2100.

Input data 401 illustrated in FIG. 5 indicates input data without DCD, while input data 403 illustrated in FIG. 5 indicates input data with DCD. Sampling points 402 indicates sampling points for the input data 401, while sampling points 404 indicates sampling points for the input data 403. One unit interval is the time duration of one-bit data of input data to be processed, or is one cycle of a bit clock.

The duty cycle of a clock signal provided to recover the input data 401 without DCD may be 50%. The number of times of sampling of the input data 401 in each of odd-numbered unit intervals 411 defined by rising edges of the clock signal may be 4, while the number of times of sampling of the input data 401 in each of even-numbered unit intervals 412 defined by falling edges of the clock signal may be 4. The unit intervals 411 and 412 may be substantially equal to each other, while the numbers of times of sampling of the input data 401 in the unit intervals 411 and 412 may be substantially equal to each other. Since the numbers of times of sampling of the input data 401 in the unit intervals 411 and 412 are substantially equal to each other, data in each of the unit intervals may be correctly recovered.

The duty cycle of a clock signal provided to recover the input data 403 with DCD is larger than 50%. For the input data 403, odd-numbered unit intervals 421 defined by rising edges of the clock signal may become long, while even-numbered unit intervals 422 defined by falling edges of the clock may become short. Intervals between the sampling points 404 in each of the odd-numbered unit intervals 421 are increased, while intervals between the sampling points 404 in each of the even-numbered unit intervals 422 are reduced. Thus, the number of times of sampling of the input data 403 in each of the odd-numbered unit intervals 421 is 4, while the number of times of sampling of the input data 403 in each of the even-numbered unit intervals 422 is 4. Since the number of times of sampling of the input data 403 having DCD in each of the unit intervals is 4, data in each of the unit intervals may be correctly recovered.

As illustrated in FIG. 4, the CDR circuit 2102 includes a multi-phase clock generating circuit 301, a frequency divider 302, an oversampling circuit 303, a demultiplexing circuit 304, a data boundary determining circuit 305 and a clock phase control circuit 306. The multi-phase clock generating circuit 301 generates multiple clock signals having a different phase in one cycle. The frequency divider 302 divides the frequencies of the clock signals which is generated by the multi-phase clock generating circuit 301 and outputs the clock signals clk.

Figure 6:
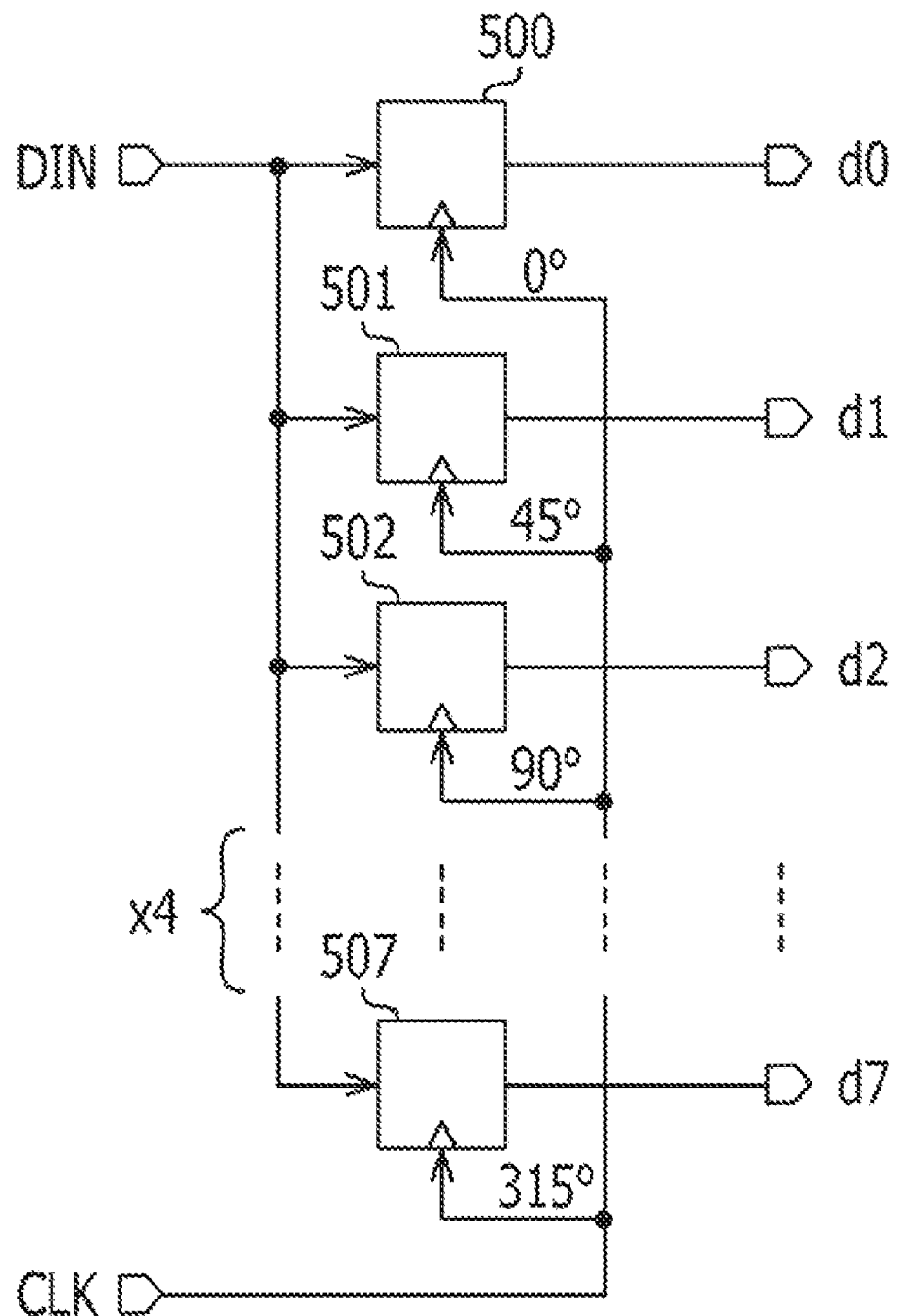
FIG. 6 illustrates an exemplary oversampling circuit.

FIG. 6 illustrates an exemplary oversampling circuit. The oversampling circuit illustrated in FIG. 6 may correspond to the oversampling circuit 303 illustrated in FIG. 4. The oversampling circuit 303 includes eight decision latch circuits 500 to 507. The decision latch circuits 500 to 507 receive the clock signals clk generated by the multi-phase clock generating circuit 301, respectively. For example, the clock signals clk may be eight clock signals with different phases shifted by 0 degrees, 45 degrees, 90 degrees, 135 degrees, 180 degrees, 225 degrees, 270 degrees and 315 degrees, respectively. The decision latch circuits 500 to 507 sample the input data din in synchronization with rising edges of the clock signals clk with the phases shifted by 0 degrees, 45 degrees, 90 degrees, 135 degrees, 180 degrees, 225 degrees, 270 degrees and 315 degrees, respectively, and generate digital data, d0 to d7 bits. The decision latch circuits 500 to 507 hold or output the d0 to d7 bits, respectively. The oversampling circuit 303 outputs digital data one bit digital data per one sampling time. One cycle may be two unit intervals (UI). The oversampling circuit 303 oversamples the input data din based on the clock signals clk having the different phases respectively which are generated by the multi-phase clock generating circuit 301. The oversampling circuit 301 then outputs a plurality of samples of the digital data corresponding to (the input data din for corresponding to one unit interval (UI). The input data din illustrated in FIG. 4 or 6 may be the input data 401 illustrated in FIG. 5. The input data 401 is oversampled to, for example, four samples of the digital data for one unit interval. The oversampling circuit 303 may output eight samples of the digital data d0 to d7 in synchronization with eight clock signals clk. In FIG. 5, one cycle period of the input data 401 without DCD, for example, two unit intervals of the input data 401 may be substantially equal to one cycle period of the input data 403 with DCD, for example, two unit intervals of the input data 403.

Figure 7:
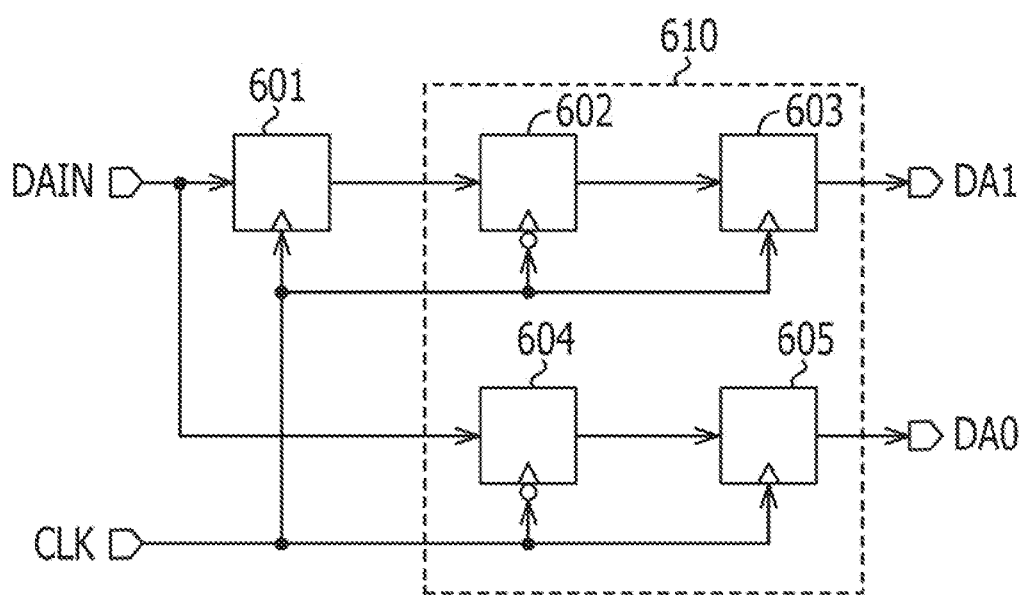
FIG. 7 illustrates an exemplary demultiplexing circuit.

FIG. 7 illustrates an exemplary demultiplexing circuit. The demultiplexing circuit illustrated in FIG. 7 may be the demultiplexing circuit 304 illustrated in FIG. 4. The demultiplexing circuit 304 includes five latch circuits 601 to 605. A flip-flop circuit 610 includes the latch circuits 602 to 605. A Clock signal clk illustrated in FIG. 7 may correspond to a clock signal obtained by dividing the frequency of the clock signal with the phase 0 degrees by half by the frequency divider 302. The latch circuit 601 samples input data dain in synchronization with rising edges of the clock signal clk and holds or outputs the sampled data. The input data dain may correspond to the data d0 illustrated in FIG. 6. The latch circuit 602 samples the data output from the latch circuit 601 in synchronization with falling edges of the clock signal clk and holds or outputs the sampled data. The latch circuit 603 samples the data output from the latch circuit 602 in synchronization with the rising edges of the clock signal clk and holds or outputs the sampled data da1. The latch circuit 604 samples the input data dain in synchronization with the falling edges of the clock signal clk and holds or outputs the sampled data. The latch circuit 605 samples the data output from the latch circuit 604 in synchronization with the rising edge of the clock signal clk and holds or outputs the sampled data da0. The serial data d0 illustrated in FIG. 6 may be converted into the two-bit parallel data da0 and da1 illustrated in FIG. 7. Each of the serial data d1 to d7 illustrated in FIG. 6 may be converted into two-bit parallel data. The demultiplexing circuit 304 converts the eight serial digital data output from the oversampling circuit 303 into, for example, sixteen parallel data in synchronization with the frequency-divided clock signals clk output from the frequency divider 302. The demultiplexing circuit 304 outputs the sixteen parallel data to the data boundary determining circuit 305. The bit rate of the input data dain may be 10 Gbps. The bit rates of the output data pieces da0 and da1 may be 5 Gbps. The demultiplexing circuit 304 may set the bit rate of the output data da0 or da1 to a bit rate at which a circuit located on the downstream side of the demultiplexing circuit 304 processes the output data.

Figure 8:
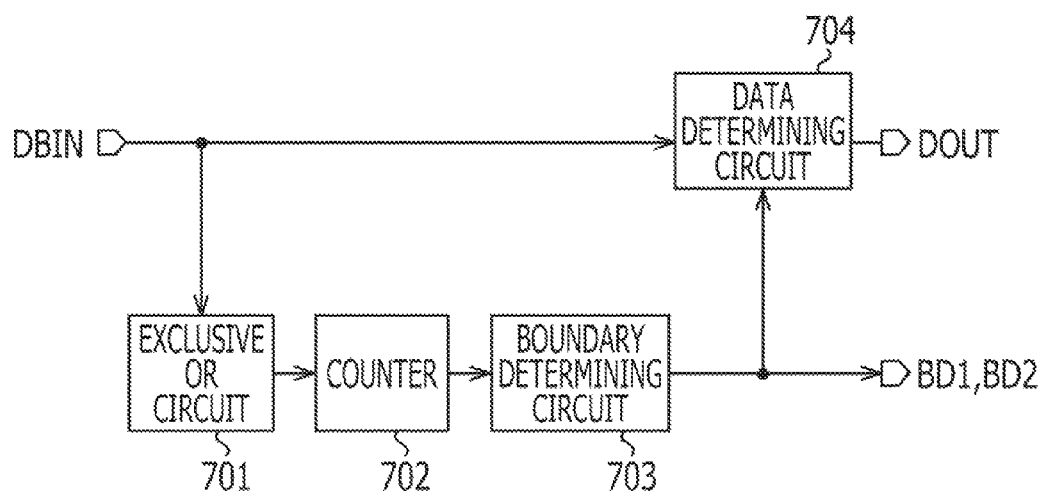
FIG. 8 illustrates an exemplary data boundary determining circuit.
Figure 9:
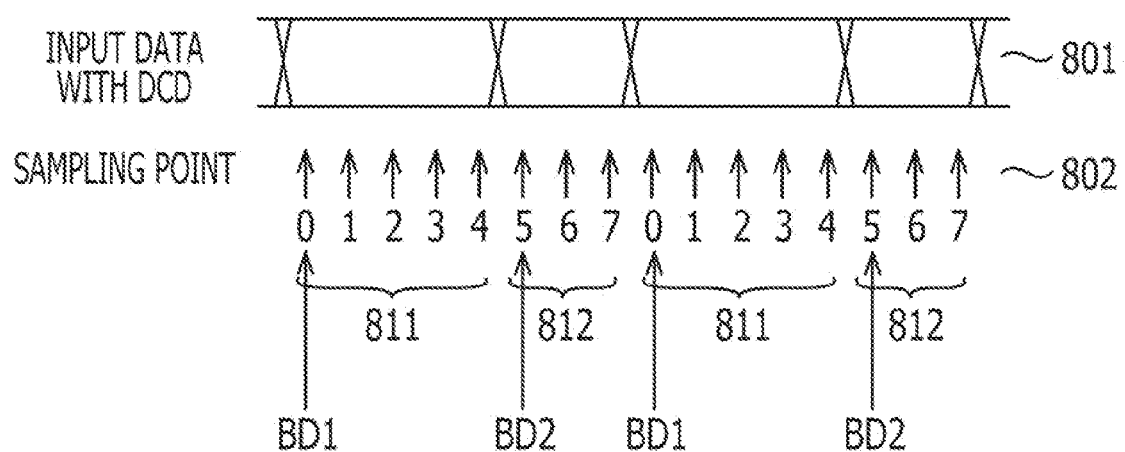
FIG. 9 illustrates an exemplary operation of the data boundary determining circuit.

FIG. 8 illustrates an exemplary data boundary determining circuit. The data boundary determining circuit illustrated in FIG. 8 may be the data boundary determining circuit 305 illustrated in FIG. 4. FIG. 9 illustrates an exemplary operation of a data boundary determining circuit. The data boundary determining circuit 305 illustrated in FIG. 8 may perform the operation illustrated in FIG. 9. Input data 801 illustrated in FIG. 9 may have DCD. Odd-numbered unit intervals 811 are long, while even-numbered unit intervals 812 are short. Sampling points 802 may be sampling points for the input data 801. The number of times of sampling of the input data 801 in each of the odd-numbered unit intervals 811 may be 5, while the number of times of sampling of the input data 801 in each of the even-numbered unit intervals 812 may be 3. Since the number of times of sampling of the input data 801 in each of the even-numbered unit intervals 812 is small, data may not be correctly recovered.

The data boundary determining circuit 305 illustrated in FIG. 8 includes an exclusive OR circuit 701, a counter 702, a boundary determining circuit 703 and a data determining circuit 704. The exclusive OR circuit 701 performs an exclusive OR operation between two chronologically-adjacent data of data dbin from the demultiplexing circuit 304 The exclusive OR operation result between data "0" and "0" is "0", the exclusive OR operation result between data "0" and "1" is "1", the exclusive OR operation result between data "1" and "0" is "0", and the exclusive OR operation result between data "1" and "1" is "1". When the chronological data is changed, the exclusive OR circuit 701 outputs data "1". When the chronological data is not changed, the exclusive OR circuit 701 outputs data "0". Changing points of the chronological data is detected from eight sampling points in one cycle illustrated in FIG. 5, for example, two unit intervals. In FIG. 9, a sampling point "0" and a sampling point "5" are detected as changing points of the chronological data. The counter 702 counts sampling points where the exclusive OR circuit 701 outputs "1". Since the input data dbin is random in a long term, the counted value of the sampling point "0" and the counted value of the sampling point "5" may become large. The boundary determining circuit 703 determines a data boundary BD1 and a data boundary BD2, which correspond to the boundaries of a unit interval, based on the values counted by the counter 702. The sampling points "0" and "5" having large counted values respectively may be determined as the data boundaries BD1 and BD2, respectively. The data determining circuit 704 outputs a digital data dout that is located at a central point between the data boundary BD1 and the data boundary BD2 in respect of the input data dbin. The data boundary determining circuit 305 receives the digital data from the demultiplexing circuit 304 and determines the data boundary BD1 and the data boundary BD2, which correspond to the boundaries of the unit interval. The data boundary determining circuit 305 outputs the digital data dout that is located at a central point between the data boundaries BD1 and BD2. The data boundary determining circuit 305 includes the counter 702 that counts the detected chronological changing points of the digital data. The data boundary determining circuit 305 determines the data boundaries BD1 and BD2 based on the values counted by the counter 702. The CDR circuit 2102 may recover the data dout and the clock signal clk based on the input data din.

Figure 10:
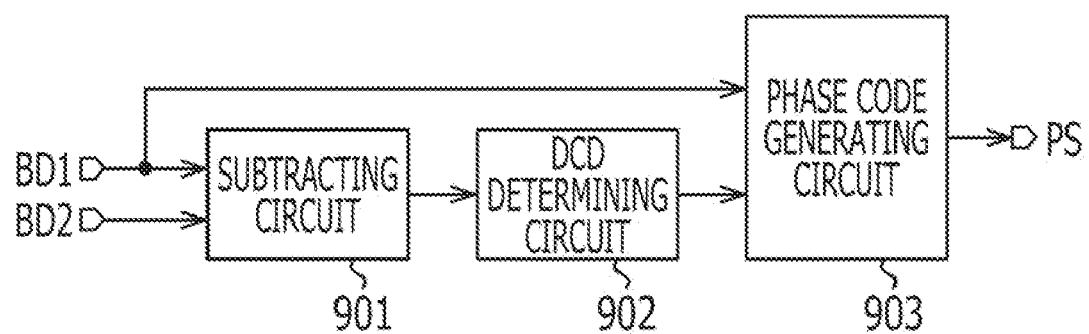
FIG. 10 illustrates an exemplary clock phase control circuit.

FIG. 10 illustrates an exemplary clock phase control circuit. The clock phase control circuit illustrated in FIG. 10 may be the clock phase control circuit 306 illustrated in FIG. 4. The clock phase control circuit 306 includes a subtracting circuit 901, a DCD determining circuit 902 and a phase code generating circuit 903. The subtracting circuit 901 subtracts the data boundary BD1 from the data boundary BD2 and outputs a subtraction result as a phase difference between the data boundary BD2 and the data boundary BD1. The DCD determining circuit 902 receives an output signal from the subtracting circuit 901. When the number of times of sampling in the unit interval between the data boundary BD1 and the data boundary BD2 is in a range of 1 to 3, the DCD determining circuit 902 outputs a DOWN signal. When the number of times of sampling in the unit interval between the data boundary BD1 and the data boundary BD2 is 4, the DCD determining circuit 902 outputs a STAY signal. When the number of times of sampling in the unit interval between the data boundary BD1 and the data boundary BD2 is in a range of 5 to 7, the DCD determining circuit 902 outputs an UP signal. For example, since the number of times of sampling of the input data 801 having DCD illustrated in FIG. 9 in the unit interval between the data boundary BD1 and the data boundary BD2 is 5, the DCD determining circuit 902 outputs the UP signal. Since the number of times of sampling of the input data 401 not having DCD illustrated in FIG. 5 in the unit interval between the data boundary BD1 and the data boundary BD2 is 4, the DCD determining circuit 902 outputs the STAY signal.

Figure 12:
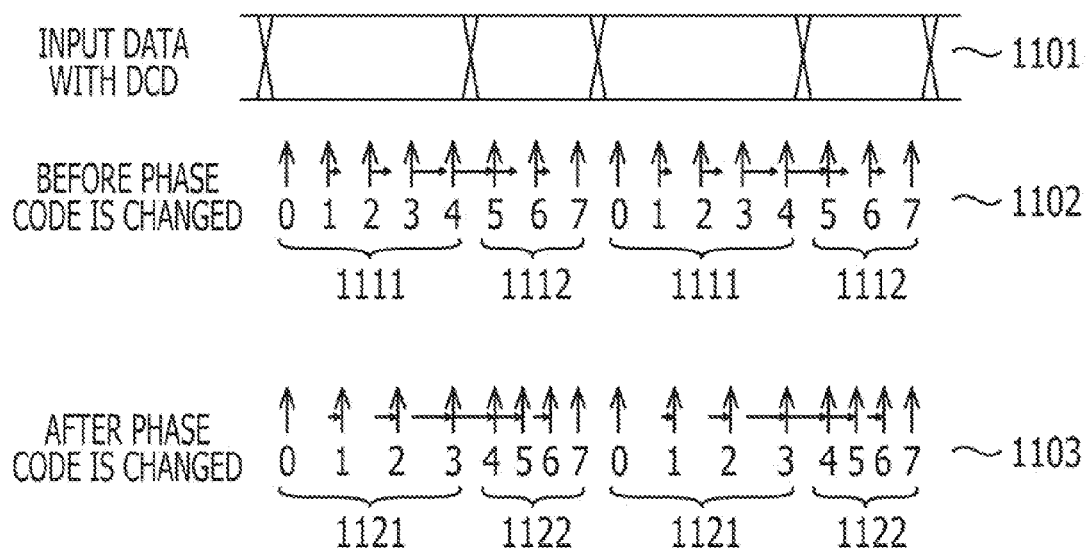
FIG. 12 illustrates an exemplary clock phase control.

FIG. 12 illustrates an exemplary clock phase control. The clock phase control circuit 306 illustrated in FIG. 10 may perform the clock phase control illustrated in FIG. 12. Input data 1101 indicates input data with DCD. The input data 1101 may correspond to the input data 801 illustrated in FIG. 9. Sampling points 1102 before a phase code is changed may be sampling points before a phase code of the clock phase control circuit 306 is changed. The number of times of sampling of the input data 1101 in each of odd-numbered unit intervals 1111 may be 5, while the number of times of sampling of the input data 1101 in each of even-numbered unit intervals 1112 may be 3. Since the number of times of sampling of the input data 1101 in the unit interval 1111 between the data boundary BD1 and the data boundary BD2 is 5, the DCD determining circuit 902 outputs the UP signal. When the phase code generating circuit 903 receives the UP signal, the phase code generating circuit 903 generates a phase code PS in order to set sampling points 1103 after the phase code is changed. In the sampling points 1103 after the phase code is changed, the number of sampling points in the odd-numbered unit interval 1121 is reduced and the number of sampling points in the even-numbered unit interval 1122 is increased, compared with the sampling points 1102 before the phase code is changed. For example, the intervals between the sampling points in the odd-numbered unit interval 1121 are expanded so that the number of the sampling points in the odd-numbered unit interval 1121 is reduced, while the intervals between the sampling points in the even-numbered unit interval 1122 are reduced so that the number of the sampling points in the even-numbered unit interval 1122 is increased. For example, differences between the phases of the multiple clock signals to be used for oversampling of the input data 1101 in the odd-numbered unit interval 1121 are increased so that the number of times of sampling of the input data 1101 in the odd-numbered unit interval is reduced, while differences between the phases of the multiple clock signals to be used for oversampling of the input data 1101 in the even-numbered unit interval 1122 are reduced so that the number of times of sampling of the input data 1101 in the even-numbered unit interval is increased. For example, in the sampling points 1103 after the phase code is changed, the phase at a sampling point "0" may be maintained, the phase at a sampling point "1" may be delayed by "+1", the phase at a sampling point "2" may be delayed by "+2", the phase at a sampling point "3" may be delayed by "+3", the phase at a sampling point "4" may be delayed by "+3", the phase at a sampling point "5" may be delayed by "+2", the phase at a sampling point "6" may be delayed by "+1", and the phase at a sampling point "7" may be maintained, as compared with the sampling points 1102 before the phase code is changed. In the sampling points 1103 after the phase code is changed, the number of times of sampling of the input data 1101 in the odd-numbered unit interval 1121 may be 4, while the number of times of sampling of the input data 1101 in the even-numbered unit interval 1122 may be 4. Thus, the data in the unit interval is recovered with high accuracy. When the number of times of sampling of the input data in a unit interval is 6 or more, feedback control is performed multiple times so that the number of times of sampling of the input data in the unit interval gradually approaches 4.

Since the number of times of sampling of the input data 401 not having DCD illustrated in FIG. 5 in the unit interval between the data boundary BD1 and the data boundary BD2 is 4, the DCD determining circuit 902 outputs the STAY signal. Since the number of times of sampling of the input data 1103, illustrated in FIG. 12, after the phase code is changed in the unit interval between the data boundary BD1 and the data boundary BD2 is 4, the DCD determining circuit 902 outputs the STAY signal. When the phase code generating circuit 903 receives the STAY signal, the phase code generating circuit 903 maintains the phase code PS. Thus, the number of times of sampling of the input data 1101 in the unit interval may be maintained.

When the number of times of sampling of the input data in the unit interval between the data boundary BD1 and the data boundary BD2 is within the range of 1 to 3, the DCD determining circuit 902 outputs the DOWN signal. The phase code generating circuit 903 generates the phase code PS based on the DOWN signal in order to set sampling points after the phase code is changed. In the sampling points after the phase code is changed, the number of times of sampling of the input data in odd-numbered unit interval is increased, and the number of times of sampling of the input data in even-numbered unit interval is reduced, as compared with the sampling points before the phase code is changed. For example, the intervals between the sampling points in the odd-numbered unit interval are reduced so that the number of the sampling points in the odd-numbered unit interval is increased, while the intervals between the sampling points in the even-numbered unit interval are increased so that the number of the sampling points in the odd-numbered unit interval is reduced. For example, the differences between the phases of the multiple clock signals to be used for sampling of the input data in the odd-numbered unit interval are reduced so that the number of times of sampling of the input data in the odd-numbered unit interval is increased, while the differences between the phases of the multiple clock signals to be used for sampling of the input data in the even-numbered unit interval are increased so that the number of times of sampling of the input data in the even-numbered unit interval is reduced. For example, in the sampling points after the phase code is changed, the phase at a sampling point "0" may be maintained, the phase at a sampling point "1" may be delayed by "4", the phase at a sampling point "2" may be delayed by "−2", the phase at a sampling point "3" may be delayed by "−3", the phase at a sampling point "4" may be delayed by "−3", the phase at a sampling point "5" may be delayed by "−2", the phase at a sampling point "6" may be delayed by "4", and the phase a sampling point "7" may be maintained, as compared with the sampling points 1102 before the phase code is changed. When the number of times of sampling of the input data in a unit interval is 2 or less, feedback control is performed multiple times so that the number of times of sampling gradually approaches 4.

Figure 11:
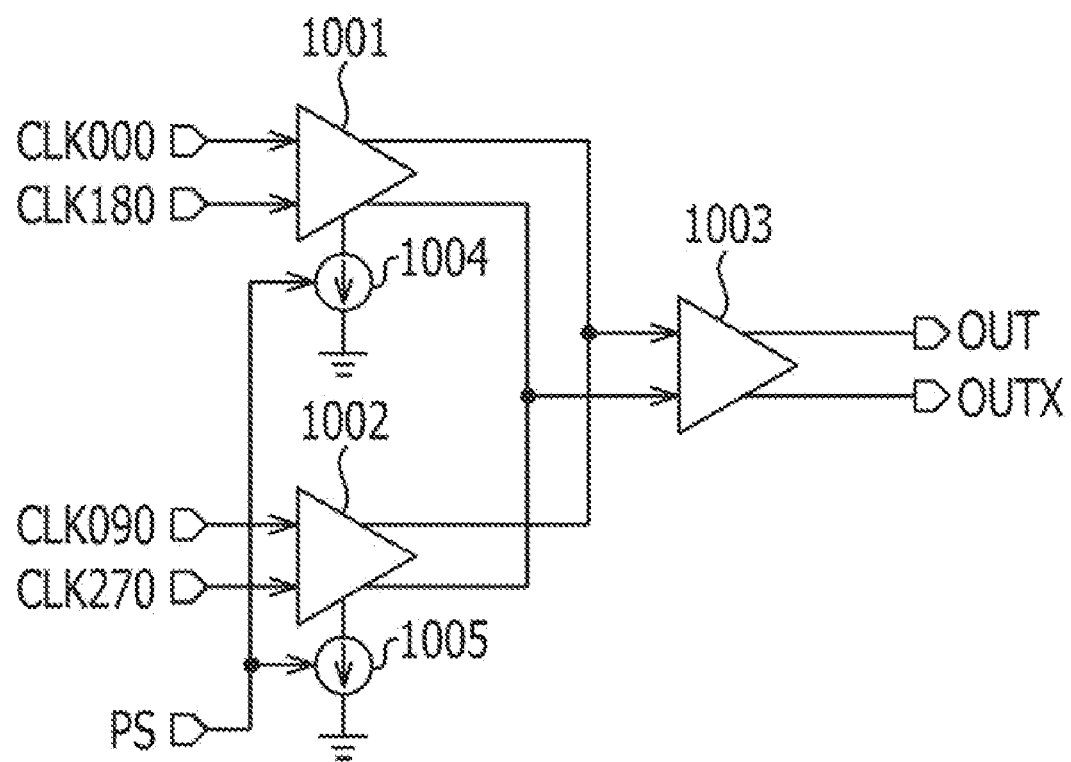
FIG. 11 illustrates an exemplary multi-phase clock control circuit.

FIG. 11 illustrates an exemplary multi-phase clock generating circuit. The multi-phase clock generating circuit illustrated in FIG. 11 may be the multi-phase clock generating circuit 301 illustrated in FIG. 4. The multi-phase clock generating circuit 301 includes buffer circuits 1001 to 1003 and current sources 1004 and 1005. The buffer circuit 1001 amplifies a differential signal between a clock signal clk000 with a phase shifted by 0 degrees and a clock signal with a phase shifted by 180 degrees. The buffer circuit 1002 amplifies a differential signal between a clock signal clk090 with a phase shifted by 90 degrees and a clock signal clk270 with a phase shifted by 270 degrees. The buffer circuit 1003 amplifies a signal obtained by summing a signal output from a positive output terminal of the buffer circuit 1001 and a signal output from a positive output terminal of the buffer circuit 1002, amplifies a signal obtained by summing a signal output from a negative output terminal of the buffer circuit 1001 and a signal output from a negative output terminal of the buffer circuit 1002, and outputs clock signals out and outx. The clock signal out corresponding to the clock signal clk with a phase shifted by 0 degrees is supplied to the oversampling circuit 303 illustrated in FIG. 6. The clock signal outx corresponding to the clock signal clk with a phase shifted by 180 degrees is supplied to the oversampling circuit 303 illustrated in FIG. 6.

The current source 1004 controls, based on the phase code PS, the ratio of the sum of the clock signal clk000 with the phase shifted by 0 degrees and the clock signal clk180 with the phase shifted by 180 degrees in the buffer circuit 1001. The current source 1005 controls, based on the phase code PS, the ratio of the sum of the clock signal clk090 with the phase shifted by 90 degrees and the clock signal clk270 with the phase shifted by 270 degrees in the buffer circuit 1002. The delays, which are within a range of 0 degrees to 90 degrees, may be added to the clock signals out and outx based on the phase code PS.

A circuit that is capable of replacing the clock clk000 with the phase shifted by 0 degrees with the clock signal clk180 with the phase shifted by 180 degrees may be provided. In addition, a circuit that is capable of replacing the clock clk090 with the phase shifted by 90 degrees with the clock signal clk270 with the phase shifted by 270 degrees may be provided. Furthermore, a circuit that is capable of replacing the clock clk000 with the phase shifted by 0 degrees with the clock signal clk180 with the phase shifted by 180 degrees and replacing the clock clk090 with the phase shifted by 90 degrees with the clock signal clk270 with the phase shifted by 270 degrees may be provided. The following eight clock signals clk: a clock signal clk with a phase shifted by 0 degrees; a clock signal clk with a phase shifted by 45 degrees; a clock signal clk with a phase shifted by 90 degrees; a clock signal clk with a phase shifted by 135 degrees; a clock signal clk with a phase shifted by 180 degrees; a clock signal clk with a phase shifted by 225 degrees; a clock signal clk with a phase shifted by 270 degrees; and a clock signal clk with a phase shifted by 315 degrees, which are supplied to the oversampling circuit 303 illustrated in FIG. 6, may be generated. The eight clock signals with phases shifted by 0 to 360 degrees respectively are generated by delaying the eight clock signals based on the phase code PS so as to generate respectively.

The amounts of delay, which are added to the eight clock signals clk with the phases shifted by 0 degrees, 45 degrees, 90 degrees, 135 degrees, 180 degrees, 225 degrees, 270 degrees and 315 degrees, which are supplied to the oversampling circuit 303, may be controlled based on the phase code PS illustrated in FIG. 6. A number of times of sampling of the input data in one unit interval may be substantially equal to another number of times of sampling of the input data in one unit interval, similar to the sampling points 1103, illustrated in FIG. 12, after the phase code is changed.

The amounts of delay, which are added to the clock signals, may be controlled by a delay circuit.

As illustrated in FIG. 12, when the number of times of sampling of the input data in the unit interval between the data boundaries BD1 and BD2 determined by the data boundary determining circuit 305 is larger than a threshold, for example, 4, the clock phase control circuit 306 may perform feedback control on the phases of the clock signals generated by the multi-phase clock generating circuit 301 so that the number of times of sampling of the input data in each of the odd-numbered unit intervals between the data boundaries BD1 and BD2 is reduced or the number of times of sampling of the input data in each of the even-numbered unit intervals is increased.

For example, when the number of times of sampling of the input data in each of the unit interval between the data boundaries BD1 and BD2 determined by the data boundary determining circuit 305 is larger than the threshold, for example, 4, the clock phase control circuit 306 may perform feedback control on the phases of the clock signals generated by the multi-phase clock generating circuit 301 so that the phase differences between the multiple clock signals for sampling of the input data in each of the odd-numbered unit intervals between the data boundaries BD1 and BD2 are increased or so that the phase differences between the multiple clock signals for sampling of the input data in each of the even-numbered unit intervals are reduced.

For example, when the number of times of sampling in each of the unit intervals between the data boundaries BD1 and BD2 determined by the data boundary determining circuit 305 is smaller than the threshold, for example, is smaller than 4, the clock phase control circuit 306 may perform feedback control on the phases of the clock signals generated by the multi-phase clock generating circuit 301 so that the number of times of sampling of the input data in each of the odd-numbered unit intervals between the data boundaries BD1 and BD2 is increased or so that the number of times of sampling of the input data in each of the even-numbered unit intervals is reduced.

For example, when the number of times of sampling of the input data in each of the unit intervals between the data boundaries BD1 and BD2 determined by the data boundary determining circuit 305 is smaller than the threshold, for example, is smaller than 4, the clock phase control circuit 306 may perform feedback control on the phases of the clock signals generated by the multi-phase clock generating circuit 301 so that the phase differences between the multiple clock signals for sampling of the input data in each of the odd-numbered unit intervals are reduced or so that the phase differences between the multiple clock signals for sampling of the input data in each of the even-numbered unit intervals are increased.

Figure 13:
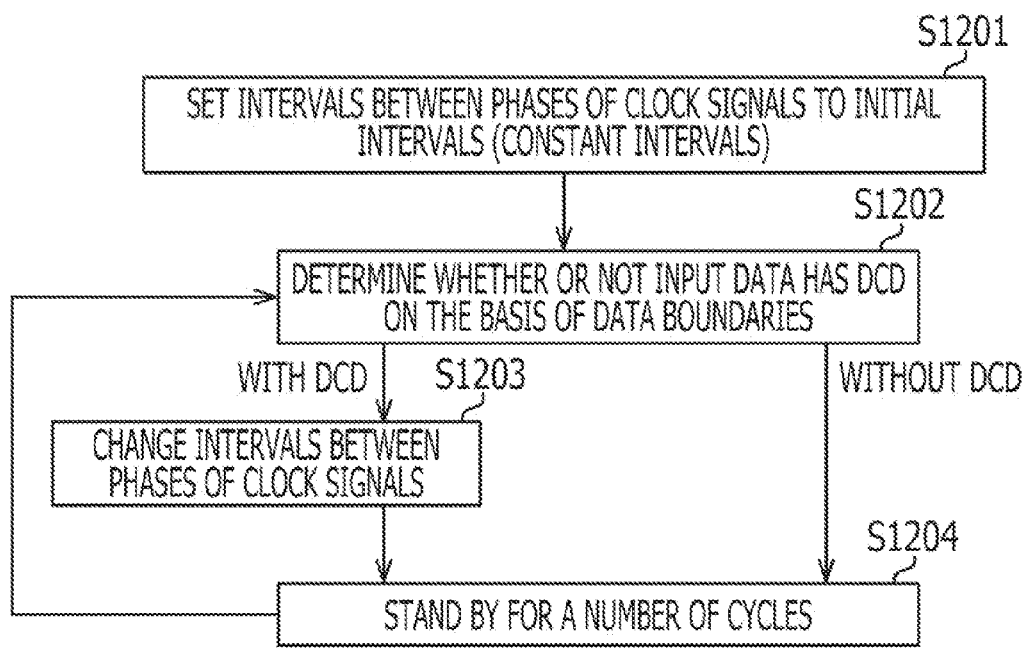
FIG. 13 illustrates an exemplary sampling clock control.

FIG. 13 illustrates an exemplary sampling clock control. The CDR circuit 2102 in the receiving circuit 2100 illustrated in FIG. 10 may perform the sampling clock control illustrated in FIG. 13. In an operation S1201, the clock phase control circuit 306 initializes the phase code PS. The multi-phase clock generating circuit 301 generates eight clock signals clk with phases that are different from each other and shifted by a substantially constant amount. In an operation S1202, the DCD determining circuit 902 in the clock phase control circuit 306 illustrated in FIG. 10 determines whether or not the input data has DCD bases on the data boundaries BD1 and BD2. For example, when the number of times of sampling of the input data in a unit interval between the two data boundaries BD1 and BD2 is within a range of 1 to 3, the DCD determining circuit 902 may determine that the input data has DCD and output the DOWN signal. When the number of times of sampling of the input data in the unit interval between the two data boundaries BD1 and BD2 is 4, the DCD determining circuit 902 may determine that the input data may not have DCD and may output the STAY signal. When the number of times of sampling of the input data in the unit interval between the two data boundaries BD1 and BD2 is within a range of 5 to 7, the DCD determining circuit 902 may determine that the input data has DCD and output the UP signal. When the input data has DCD, the process proceeds to an operation S1203. When the input data does not have DCD, the process proceeds to an operation S1204. In the operation S1203, the phase code generating circuit 903 illustrated in FIG. 10 generates a phase code PS based on the DOWN signal or the UP signal. The multi-phase clock generating circuit 301 changes the intervals between the phases of the clock signals based on the generated phase code PS. When the input data has DCD, the clock phase control circuit 306 performs feedback control so as to change the intervals between the phases of the clock signals. The oversampling circuit 303 oversamples the next input data based on the clock signals with the change phase intervals. The process proceeds to the operation S1204. In the operation S1204, after a number of cycles, the process returns to the operation S1202. After the loop process is repeated, the number of times of sampling of the input data in the unit interval may become a certain number. The clock phase control circuit 306 controls the multi-phase clock generating circuit 301 so that a number of times of sampling of the input data in a unit interval, for example, each of the number of times of the sampling of the input data in a unit interval and the number of times of the sampling of the input data in a unit interval adjacent to the unit interval becomes a substantially constant number. The input data with DCD may be recovered with high accuracy. Data that is recovered at the initial process may not be reliable and may be discarded.

When one cycle of each of the multi-phase clock signals is set to a length that is equal to or longer than two unit intervals in the oversampling circuit 303, demultiplexing may be performed. For example, when one cycle of each of the multi-phase clock signals is set to two unit intervals in the oversampling circuit 303, 2:1 demultiplexing may be performed.

Figure 14:
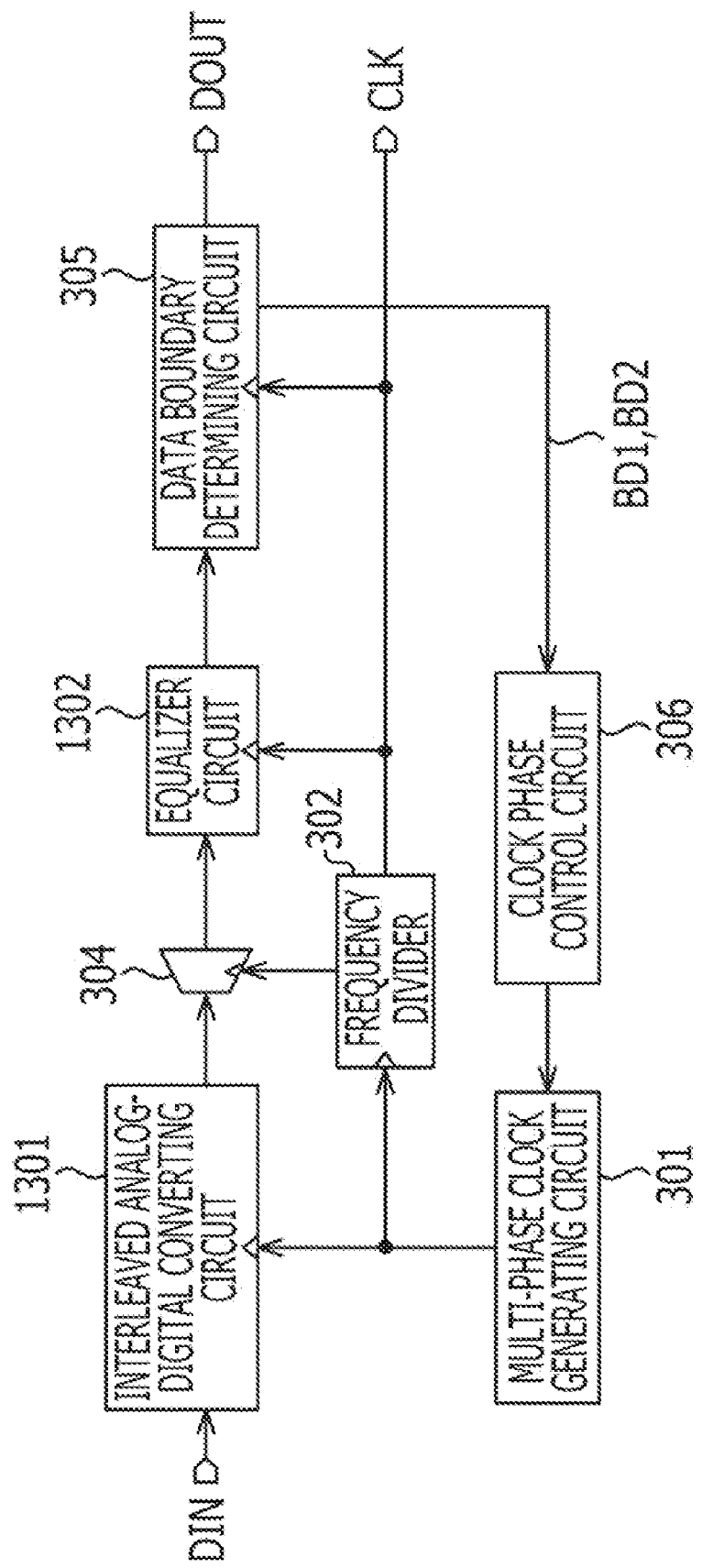
FIG. 14 illustrates an exemplary CDR circuit.

FIG. 14 illustrates an exemplary CDR circuit. The CDR circuit illustrated in FIG. 14 may be provided in the receiving circuit 2100. The CDR circuit illustrated in FIG. 14 may include an interleaved analog-digital converting circuit 1301 and an equalizer circuit 1302. The interleaved analog-digital converting circuit 1301 may be provided instead of the oversampling circuit illustrated in FIG. 4. The oversampling circuit 303 may include the interleaved analog-digital converting circuit 1301.

Figure 15:
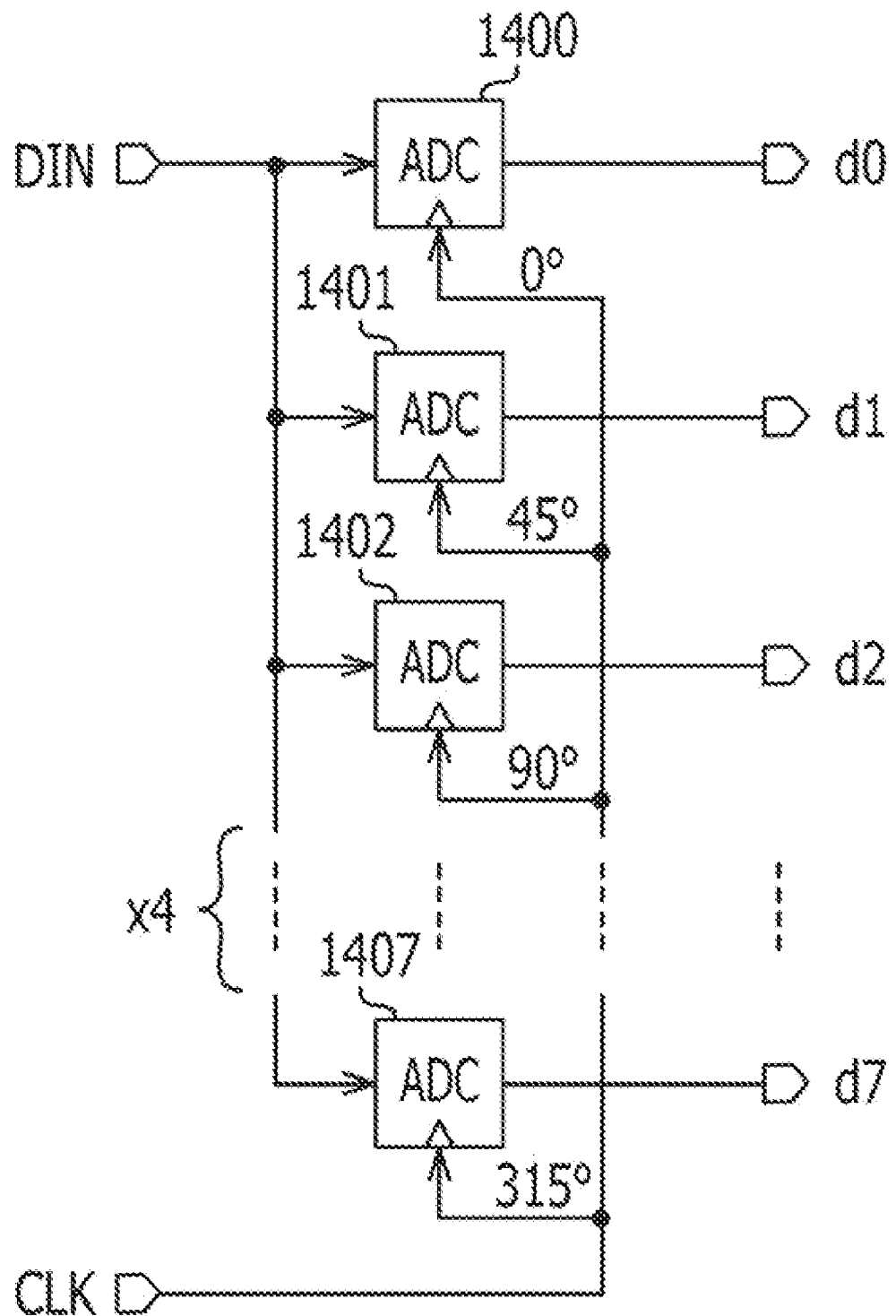
FIG. 15 illustrates an exemplary interleaved analog-digital converting circuit.

FIG. 15 illustrates an exemplary interleaved analog-digital converting circuit. The interleaved analog-digital converting circuit 1301 includes eight analog-digital converting circuits 1400 to 1407 that are operated in a time sharing manner. The interleaved analog-digital converting circuit 1301 receives the eight clock signals generated by the multi-phase clock generating circuit 301. The analog-digital converting circuits 1400 to 1407 convert the input data din from analog data to digital data in synchronization with the rising edges of the clock signals clk with the phases shifted by 0 degrees, 45 degrees, 90 degrees, 135 degrees, 180 degrees, 225 degrees, 270 degrees and 315 degrees, respectively, and generate digital data d0 to d7 of multiple bits, respectively. The analog-digital converting circuits 1400 to 1407 then output the digital data pieces d0 to d7 of multiple bits, respectively. The digital data d0 may be data of 4 to 6 bits, while each of the digital data d1 to d7 may be data of 4 to 6 bits. The interleaved analog-digital converting circuit 1301 includes the analog-digital converting circuits 1400 to 1407 that each output a digital data of multiple bits for each sampling time. The interleaved analog-digital converting circuit 1301 oversamples the input data din based on the clock signals clk with the phases that are different from each other and outputs a plurality of samples of the input data din corresponding to one unit interval (UI), for example, 4 samples. The oversampling circuit 303 illustrated in FIG. 4 outputs the digital data d0 to d7 of one bit. The interleaved analog-digital converting circuit 1301 outputs the digital data d0 to d7 of multiple bits.

Figure 16:
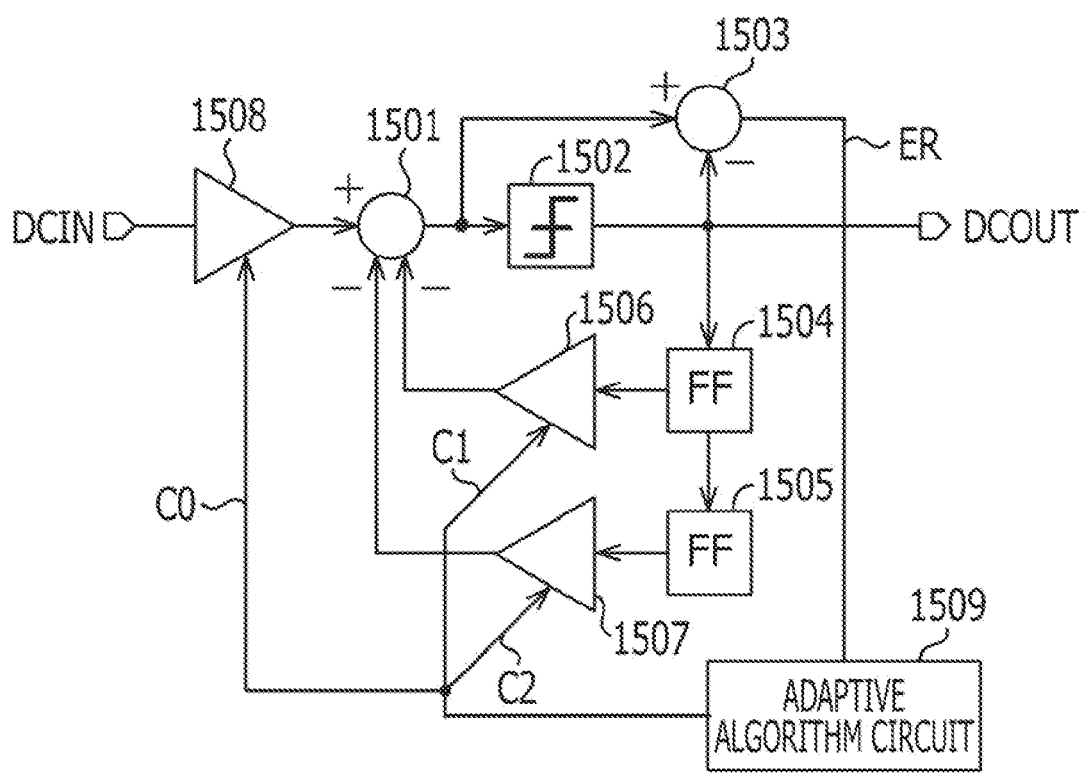
FIG. 16 illustrates an exemplary equalizer circuit.

FIG. 16 illustrates an exemplary equalizer circuit. The equalizer circuit illustrated in FIG. 16 may be the equalizer circuit 1302 illustrated in FIG. 14. The equalizer circuit 1302 performs waveform equalization on a digital data dcin of multiple bits. The equalizer circuit 1302 includes subtracting circuits 1501 and 1503, a slicer circuit 1502, flip-flop circuits 1504 and 1505, multiplying circuits 1506 to 1508 and an adaptive algorithm circuit 1509. The equalizer circuit 1302 receives the digital data dcin of multiple bits from the demultiplexing circuit 304. The multiplying circuit 1508 multiplies the digital data dcin by a coefficient C0 and outputs the multiplied data. The subtracting circuit 1501 subtracts data output from the multiplying circuits 1506 and 1507 from the data output from the multiplying circuit 1508, and outputs the subtracted data. The slicer circuit 1502 makes a binary determination of the digital data having multiple bits output from the subtracting circuit 1501 and converts the digital data into one-bit digital data dcout that indicates "0" or "1". The slicer circuit 1502 outputs the digital data dcout. The subtracting circuit 1503 subtracts the data output from the slicer circuit 1502 from the data output from the subtracting circuit 1501, and outputs an error ER. The adaptive algorithm circuit 1509 receives the error ER and outputs coefficients C0, C1 and C2 that cause the error ER to be reduced. The flip-flop circuit 1504 delays the digital data dcout output from the slicer circuit 1502 by one unit interval and outputs the delayed digital data. The flip-flop circuit 1505 delays the data output from the flip-flop circuit 1504 by one unit interval and outputs the delayed data. Therefore, the flip-flop circuit 1505 outputs the data which is delayed by two unit intervals. The multiplying circuit 1506 multiplies the data, which is delayed by one unit interval and is output from the flip-flop circuit 1504, by the coefficient C1 and outputs the multiplication result to the subtracting circuit 1501. The multiplying circuit 1507 multiplies the data, which is delayed by two unit intervals and is output from the flip-flop circuit 1505, by the coefficient C2 and outputs the multiplication result to the subtracting circuit 1501. When the bit rate of the digital data dcin is high, rising edges or falling edges of the multi-bit digital data piece dcin may be gradual. Since the equalizer circuit 1302 performs the waveform equalization on the digital data piece dcin, the falling edges of the waveform of the digital data piece dcin becomes steep. An equalizer circuit that recovers the rising edges of the digital data dcin, or an equalizer circuit that recovers the rising edges and falling edges of the digital data piece dcin may be provided. The equalizer circuit 1302 performs the waveform equalization on the multi-bit digital data dcin output from the demultiplexing circuit 304, converts the multi-bit digital data dcin into the one-bit digital data dcout, and outputs the one-bit digital data dcout to the data boundary determining circuit 305.

Figure 17:
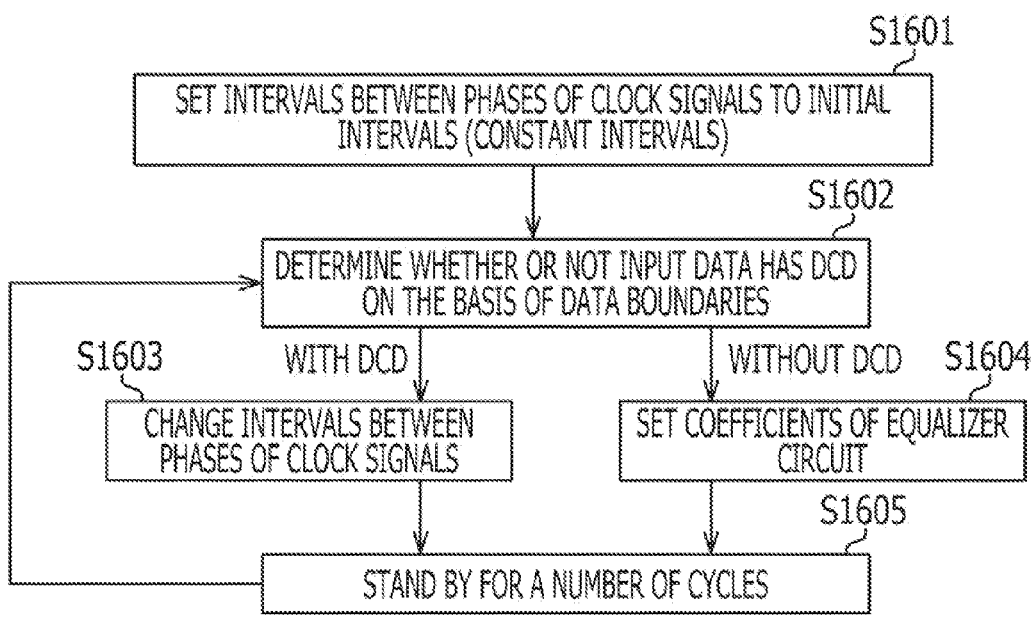
FIG. 17 illustrates an exemplary sampling clock control.

FIG. 17 illustrates an exemplary sampling clock control. The CDR circuit 2102 in the aforementioned receiving circuit 2100 may perform the sampling clock control illustrated in FIG. 17. In an operation S1601, the clock phase control circuit 306 sets the phase code PS to an initial state. The multi-phase clock generating circuit 301 generates eight clock signals clk with phases that are different from each other and shifted by a certain amount. In an operation S1602, the DCD determining circuit 902 in the clock phase control circuit 306 illustrated in FIG. 10 determines whether or not the input data has DCD based on the data boundaries BD1 and BD2, for example. For example, when the number of times of sampling of the input data in the unit interval between the data boundary BD1 and the data boundary BD2 is within a range of 1 to 3, the DCD determining circuit 902 determines that the input data has DCD, and the DCD determining circuit 902 outputs the DOWN signal. When the number of times of sampling of the input data in the unit interval between the data boundary BD1 and the data boundary BD2 is 4, the DCD determining circuit 902 determines that the input data does not have DCD, and the DCD determining circuit 902 outputs the STAY signal. When the number of times of sampling of the input data in the unit interval between the data boundary BD1 and the data boundary BD2 is within a range of 5 to 7, the DCD determining circuit 902 determines that the input data has DCD, and the DCD determining circuit 902 outputs the UP signal. When the input data has DCD, the process proceeds to an operation S1603. When the input data does not have DCD, the process proceeds to an operation S1604. In the operation S1603, the phase code generating circuit 903 illustrated in FIG. 10 generates a phase code PS based on the DOWN signal or the UP signal, for example. The multi-phase clock generating circuit 301 changes the intervals between the phases of the clock signals based on the generated phase code PS. After the operation S1603, the process proceeds to an operation S1605. In the operation S1604, the adaptive algorithm circuit 1509 in the equalizer circuit 1302 illustrated in FIG. 16 sets the coefficients C0, C1 and C2 so that the value of the error ER is reduced, for example. After the operation S1604, the process proceeds to an operation S1605. In the operation S1605, after a number of cycles, the process returns to operation the S1602. After the loop process is repeated, the number of times of sampling of the input data in each of the unit intervals is set to a certain number, and the value of the error ER of the equalizer circuit 1302 is reduced. Thus, even when the input data has DCD, the data may be recovered with high accuracy.

Figure 18:
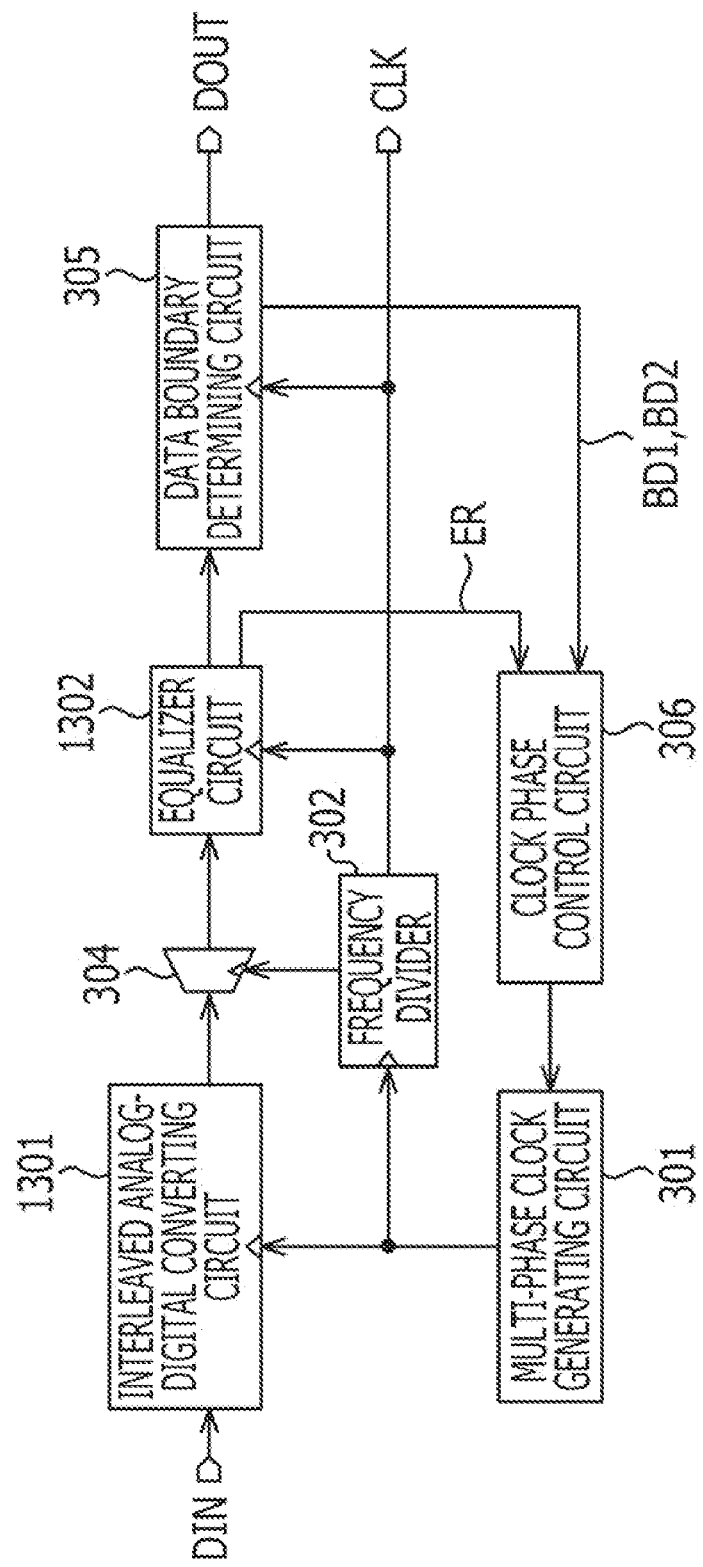
FIG. 18 illustrates an exemplary CDR circuit.

FIG. 18 illustrates an exemplary CDR circuit. The CDR circuit illustrated in FIG. 18 may be the CDR circuit 2102 in the receiving circuit 2100. The phase control circuit 306 illustrated in FIG. 17 receives the error ER from the equalizer circuit 1302. The other elements illustrated in FIG. 18 are similar to or substantially the same as the elements illustrated in FIG. 14, and a description thereof may be omitted or reduced.

Figure 19:
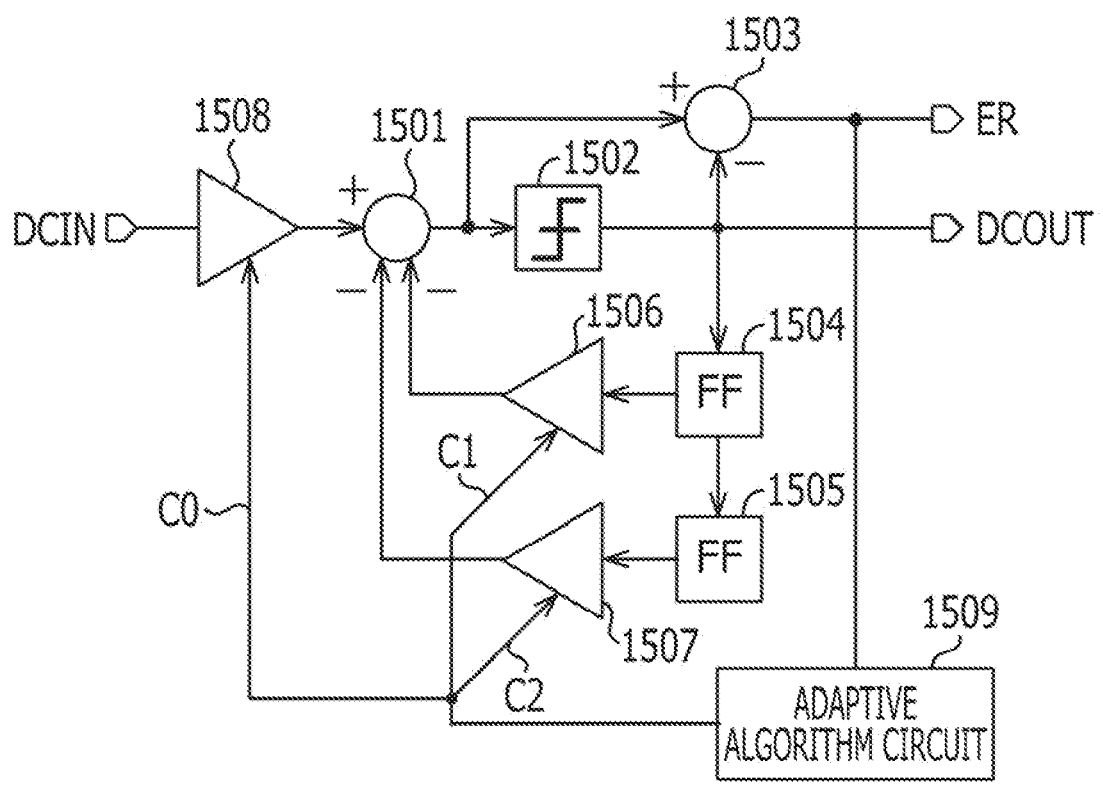
FIG. 19 illustrates an exemplary equalizer circuit.

FIG. 19 illustrates an exemplary equalizer circuit. The equalizer circuit illustrated in FIG. 19 may be the equalizer circuit 1302 illustrated in FIG. 18. The subtracting circuit 1503 outputs the error ER to the adaptive algorithm circuit 1509 illustrated in FIG. 19 and the clock phase control circuit 306 illustrated in FIG. 18. The other elements illustrated in FIG. 19 may be similar to or substantially the same as the elements illustrated in FIG. 16.

Figure 20:
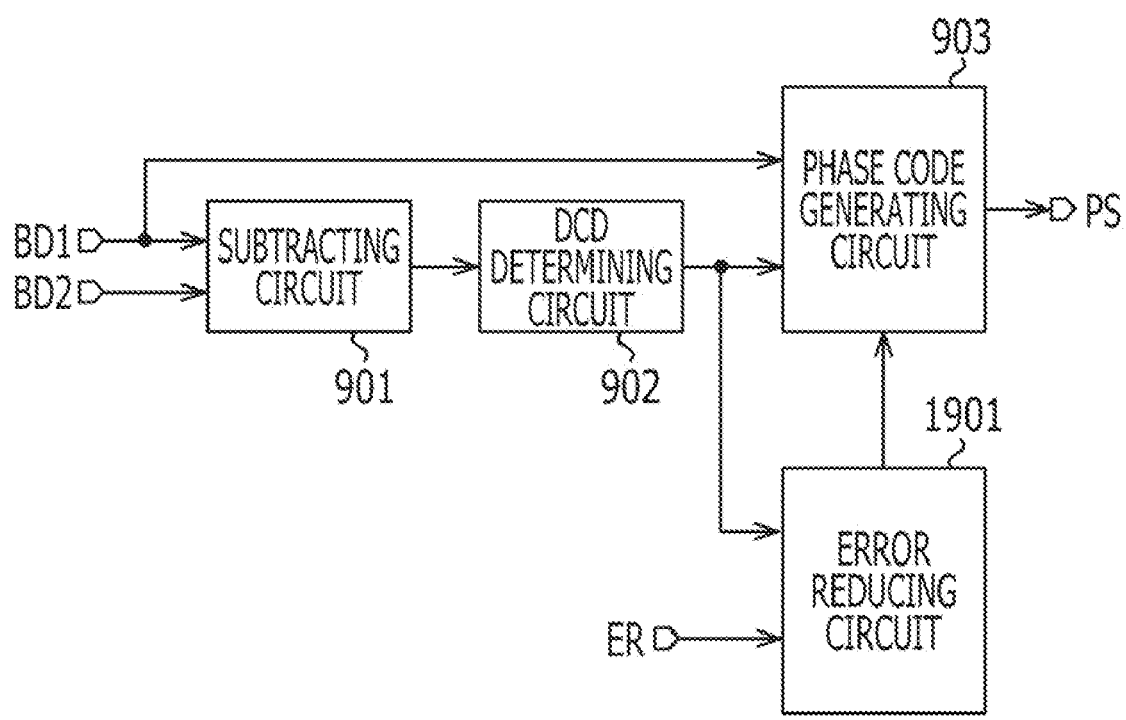
FIG. 20 illustrates an exemplary phase control circuit.

FIG. 20 illustrates an exemplary phase control circuit. The phase control circuit illustrated in FIG. 20 may be the clock phase control circuit 306 illustrated in FIG. 18. The clock phase control circuit 306 illustrated in FIG. 20 includes an error reducing circuit 1901. The other elements illustrated in FIG. 20 are similar to or substantially the same as the elements illustrated in FIG. 10, and a description thereof may be omitted or reduced. When the number of times of sampling of the input data in the unit interval between the data boundary BD1 and the data boundary BD2 is within a range of 1 to 3, the DCD determining circuit 902 determines that the input data has DCD, and the DCD determining circuit 902 outputs the DOWN signal. When the number of times of sampling of the input data in the unit interval between the data boundary BD1 and the data boundary BD2 is 4, the DCD determining circuit 902 determines that the input data does not have DCD, and the DCD determining circuit 902 outputs the STAY signal. When the number of times of sampling of the input data in the unit interval between the data boundary BD1 and the data boundary BD2 is within a range of 5 to 7, the DCD determining circuit 902 determines that the input data has DCD, and the DCD determining circuit 902 outputs the UP signal. When the DCD determining circuit 902 outputs the STAY signal, the error reducing circuit 1901 may operate. When the DCD determining circuit 902 outputs the DOWN signal or the UP signal, the error reducing circuit 1901 may not operate. After the error reducing circuit 1901 receives the STAY signal and a certain number of cycles elapse, the error reducing circuit 1901 outputs the UP or DOWN signal corresponding to the phases of the clock signals to the phase code generating circuit 903 based on the error ER. When the phase code generating circuit 903 receives the UP or DOWN signal from the error reducing circuit 1901, the phase code generating circuit 903 generates a phase code PS for shifting the phases of the clock signals by a positive amount or a negative amount while maintaining the intervals between the phases of the clock signals. When the value of the error ER is reduced as compared with the value of the previous error ER after the error reducing circuit 1901 outputs the UP signal, the error reducing circuit 1901 outputs the UP signal again to reduce the value of the error ER. When the value of the error ER is increased as compared with the value of the previous error ER after the error reducing circuit 1901 outputs the UP signal, the error reducing circuit 1901 outputs the DOWN signal to reduce the value of the error ER. The phase code generating circuit 903 holds the previous phase code PS and controls the phases of the clock signals based on the UP signal or the DOWN signal.

The subtracting circuit 1503 in the equalizer circuit 1302 outputs the error ER that indicates the difference between the multi-bit digital data subjected to the waveform equalization and the one-bit digital data output from the slicer circuit 1502. The clock phase control circuit 306 and the multi-phase clock generating circuit 301 receive the error ER indicating the difference from the equalizer circuit 1302, and change absolute phases of the clock signals with the phases that are different from each other so that the value of the error ER is reduced.

Figure 21:
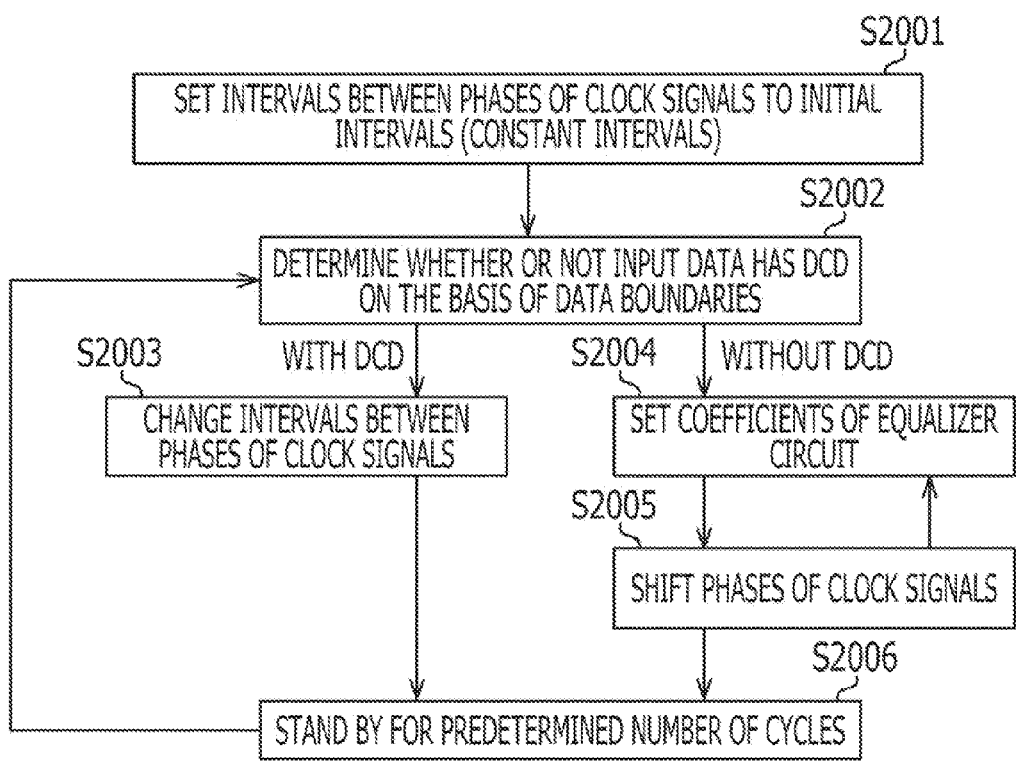
FIG. 21 illustrates an exemplary sampling clock control.

FIG. 21 illustrates an exemplary sampling clock control. The CDR circuit 2102 in the receiving circuit 2100 may perform the sampling clock control illustrated in FIG. 21. In an operation S2001, the clock phase control circuit 306 sets the phase code PS to an initial state. The multi-phase clock generating circuit 301 generates eight clock signals clk with phases that are different from each other and shifted by a certain amount. In an operation S2002, the DCD determining circuit 902 in the clock phase control circuit 306 illustrated in FIG. 10 determines whether or not the input data has DCD based on the data boundaries BD1 and BD2, for example. For example, when the number of times of sampling of the input data in the unit interval between the data boundary BD1 and the data boundary BD2 is within a range of 1 to 3, the DCD determining circuit 902 determines that the input data has DCD, and the DCD determining circuit 902 outputs the DOWN signal. When the number of times of sampling of the input data in the unit interval between the data boundary BD1 and the data boundary BD2 is 4, the DCD determining circuit 902 determines that the input data does not have DCD, and the DCD determining circuit 902 outputs the STAY signal. When the number of times of sampling of the input data in the unit interval between the data boundary BD1 and the data boundary BD2 is within a range of 5 to 7, the DCD determining circuit 902 determines that the input data has DCD, and the DCD determining circuit 902 outputs the UP signal. When the input data has DCD, the process proceeds to an operation S2003. When the input data does not have DCD, the process proceeds to an operation S2004. In the operation S2003, the phase code generating circuit 903 illustrated in FIG. 10 generates a phase code PS based on the UP or DOWN signal output from the DCD determining circuit 902, for example. The multi-phase clock generating circuit 301 changes the intervals between the phases of the clock signals based on the phase code PS. After the operation S2003, the process proceeds to an operation S2006. In the operation S2004, the adaptive algorithm circuit 1509 in the equalizer circuit 1302 illustrated in FIG. 16 sets the coefficients C0, C1 and C2 so that the value of the error ER is reduced, for example. In the operation S2005, the error reducing circuit 1901 in the clock phase control circuit 306 illustrated in FIG. 20 outputs the UP signal or the DOWN signal so that the value of the error ER is reduced, for example. The phase code generating circuit 903 shifts the phases of the clock signals based on the UP or DOWN signal output from the error reducing circuit 1901. The setting of the coefficients of the equalizer circuit 1302 in the operation S2004 and the shifting of the phases of the clock signals in the operation S2005 are alternately repeated certain times. Then, the process proceeds to the operation S2006. In the operation S2006, after a certain number of cycles, the process proceeds to the operation S2002. After the loop process is repeated, the number of sampling times in the unit interval becomes a certain number, and the value of the error ER of the equalizer circuit 1302 is reduced. Thus, when the input data has DCD, the data may be recovered with high accuracy.

When the input data includes DCD, the intervals between the phases of the clock signals in a long unit interval are increased by controlling the clock signals while the intervals between the phases of the clock signals in a short unit interval are reduced by controlling the clock signals. Thus, the number of sampling times in each of the unit intervals may be maintained substantially equal to a certain number. The sensitivity of reception of the input data with DCD may not be reduced. For example, when the number of sampling times in a unit interval is reduced by X times in N multiplication oversampling, an error rate may not increase to $1/(N-X)$ and may reduce to $1/N$.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A receiving circuit comprising:
a clock generating circuit to generate a plurality of clock signals in a cycle;
an oversampling circuit to oversample input data based on the plurality of clock signals and output a plurality of samples of digital data in a unit interval;
a data boundary determining circuit to detect a changing point of the digital data, determine data boundaries of the unit interval based on the changing point, and output digital data corresponding to a central data between the data boundaries; and
a clock phase control circuit to control a phase of at least one of the plurality of clock signals so that a first number of the plurality of samples becomes a certain value when a second number of samples between the data boundaries is larger than a threshold value.

2. The receiving circuit according to claim 1 wherein the clock phase control circuit controls a phase of at least one of the plurality of clock signals so that the first number becomes the certain value when the second number is smaller than the threshold value.

3. The receiving circuit according to claim 1 wherein the oversampling circuit outputs one-bit digital data for each of the plurality of samples.

4. The receiving circuit according to claim 1 wherein the oversampling circuit includes:
an analog-digital converting circuit to output multi-bit digital data for each of the plurality of samples; and
an equalizer circuit to waveform-equalize the multi-bit digital data, convert the multi-bit digital data into one-bit digital data, and output the one-bit digital data to the data boundary determining circuit.

5. The receiving circuit according to claim 4 wherein the equalizer circuit outputs a difference between waveform-equalized multi-bit digital data and the one-bit digital data, and
wherein the clock phase control circuit shifts an absolute phase of at least one of the plurality of clock signals to reduce the difference.

6. The receiving circuit according to claim 1 wherein the data boundary determining circuit includes a counter to count the changing point of the digital data and detect the data boundaries based on a counted value.

7. The receiving circuit according to claim 1 wherein the clock phase control circuit controls a phase of at least one of the plurality of clock signals so that all samples in a unit interval, which are detected by the oversampling circuit, become the certain value.

8. The receiving circuit according to claim 1 wherein the clock phase control circuit increases a phase difference between at least two of the plurality of clock signals for oversampling during a first unit interval and reduces a phase difference between at least two of the plurality of clock signals for oversampling during a second unit interval preceding or succeeding the first unit interval when the second number is larger than the threshold value.

9. A sampling clock control method comprising:
generating a plurality of clock signals in a cycle;
oversampling input data based on the plurality of clock signals;
outputting a plurality of samples of digital data digital data in a unit interval;
detecting a changing point of the digital data;
determining data boundaries of the unit interval based on the changing point;
outputting digital data corresponding to a central data between the data boundaries; and
controlling a phase of at least one of the plurality of clock signals so that a first number of the plurality of samples becomes a certain vale when a second number of samples between the data boundaries is larger than a threshold.

10. The sampling clock control method according to claim 9, further comprising,
controlling a phase of at least one of the plurality of clock signals so that the first number becomes the certain value when the second number is smaller than the threshold value.

11. The sampling clock control method according to claim 9, further comprising,
outputting one-bit digital data for each of the plurality of samples.

12. The sampling clock control method according to claim 9, further comprising:

outputting multi-bit digital data for each of the plurality of samples; and waveform-equalizing the multi-bit digital data, converting the multi-bit digital data into one-bit digital data, and outputting the one-bit digital data.

13. The sampling clock control method according to claim 12 further comprising:

outputting a difference between waveform-equalized multi-bit digital data and the one-bit digital data, and shifting an absolute phase of at least one of the plurality of clock signals to reduce the difference.

14. The sampling clock control method according to claim 9 further comprising:

counting the changing point of the digital data; and detecting the data boundaries based on a counted value.

15. The sampling clock control method according to claim 9, further comprising, controlling a phase of at least one of the plurality of clock signals so that all samples in a unit interval, which are detected by the oversampling, become the certain value.

16. The sampling clock control method according to claim 9, further comprising, increasing a phase difference between at least two of the plurality of clock signals for oversampling during a first unit interval and reduces a phase difference between at least two of the plurality of clock signals for oversampling during a second unit interval preceding or succeeding the first unit interval when the second number is larger than the threshold value.

* * * * *